(12) United States Patent
Sugimura et al.

(10) Patent No.: US 9,304,172 B2
(45) Date of Patent: Apr. 5, 2016

(54) BATTERY CONDITION ESTIMATING METHOD AND POWER SYSTEM

(75) Inventors: Takezo Sugimura, Tokyo (JP); Etsuzo Sato, Tokyo (JP)

(73) Assignees: FURUKAWA ELECTRIC CO., LTD., Tokyo (JP); FURUKAWA AUTOMOTIVE SYSTEMS INC., Inukami-gun (JP)

( * ) Notice: Subject to any disclaimer, the term of this patent is extended or adjusted under 35 U.S.C. 154(b) by 826 days.

(21) Appl. No.: 13/433,599

(22) Filed: Mar. 29, 2012

(65) Prior Publication Data

US 2012/0187917 A1     Jul. 26, 2012

Related U.S. Application Data

(63) Continuation of application No. PCT/JP2010/067332, filed on Oct. 4, 2010.

(51) Int. Cl.
*H02J 7/00* (2006.01)
*G01R 31/36* (2006.01)
*H01M 10/44* (2006.01)
*H01M 10/42* (2006.01)

(52) U.S. Cl.
CPC ........ *G01R 31/3662* (2013.01); *G01R 31/3679* (2013.01); *H01M 10/425* (2013.01); *H01M 10/44* (2013.01); *H01M 10/446* (2013.01); *H01M 10/448* (2013.01); *H01M 2010/4271* (2013.01)

(58) Field of Classification Search
USPC ........................................................ 320/136
See application file for complete search history.

(56) References Cited

U.S. PATENT DOCUMENTS

| 6,850,036 B2 | 2/2005 | Lin et al. |
| 7,362,074 B2 | 4/2008 | Iwane et al. |

(Continued)

FOREIGN PATENT DOCUMENTS

| CN | 1791804 A | 6/2006 |
| CN | 101187697 A | 5/2008 |

(Continued)

OTHER PUBLICATIONS

Office Action issued Aug. 10, 2012 in Japanese Application No. 2009-073584 (With English Translation).

(Continued)

*Primary Examiner* — Yalkew Fantu
(74) *Attorney, Agent, or Firm* — Oblon, McClelland, Maier & Neustadt, L.L.P.

(57) ABSTRACT

The invention provides a battery condition estimating method and a power system permitting to estimate aging level or discharge ability of a battery in high precision by reducing transient changes of response voltages caused by repetitive discharges. A recovery time after a discharge is prolonged with a number of times of discharge and a relationship between the number of times of discharge and the recovery time is approximated by using an exponential function in the battery condition estimating method of the invention. A discharge pattern as shown in FIG. 1 is formed by using the recovery time obtained from this approximation and substantially constant response voltage is obtained by discharging the battery in accordance to this discharge pattern. Then, impedance during a metastable condition is calculated from the measured response voltage and the discharge current and the aging level or the discharge ability of the battery is determined from the impedance.

17 Claims, 5 Drawing Sheets

(56) References Cited

U.S. PATENT DOCUMENTS

| | | | |
|---|---|---|---|
| 7,471,067 B2* | 12/2008 | Tamezane et al. | 320/132 |
| 7,593,823 B2 | 9/2009 | Iwane et al. | |
| 8,466,684 B2 | 6/2013 | Melichar | |
| 2003/0184307 A1* | 10/2003 | Kozlowski et al. | 324/427 |
| 2004/0164712 A1 | 8/2004 | Lin et al. | |
| 2006/0158155 A1 | 7/2006 | Tamezane et al. | |
| 2006/0186890 A1 | 8/2006 | Iwane et al. | |
| 2007/0159137 A1* | 7/2007 | Verbrugge et al. | 320/132 |
| 2008/0007224 A1 | 1/2008 | Melichar | |
| 2008/0120050 A1* | 5/2008 | Iwane et al. | 702/63 |
| 2009/0027007 A1* | 1/2009 | Iwane et al. | 320/129 |
| 2011/0112782 A1 | 5/2011 | Majima et al. | |

FOREIGN PATENT DOCUMENTS

| | | |
|---|---|---|
| CN | 101506677 A | 8/2009 |
| JP | 2002-156427 | 5/2002 |
| JP | 3367320 B1 | 11/2002 |
| JP | 2004-301724 A | 10/2004 |
| JP | 2005-100969 | 4/2005 |
| JP | 2006-194789 | 7/2006 |
| JP | 2010-156702 A | 7/2010 |
| WO | WO 2007/149289 A1 | 12/2007 |
| WO | WO 2010/004985 A1 | 1/2010 |

OTHER PUBLICATIONS

Office Action issued Aug. 28, 2014 in Chinese Patent Application No. 201080030075.4 (with English language translation).

International Search Report mailed on Dec. 28, 2010, issued for International Application No. PCT/JP2010/067332, filed on Oct. 4, 2010.

Combined Office Action and Search Report issued Jan. 13, 2014 in Chinese Patent Application No. 201080030075.4 with English language translation and English translation.

* cited by examiner

BATTERY CONDITION ESTIMATING METHOD AND POWER SYSTEM

TECHNOLOGICAL FIELD

The present invention relates to a battery condition estimating method and a power system for estimating conditions such as aging level and discharge ability of a battery that supplies power to a load and more specifically to a battery condition estimating method and others for estimating the aging level and discharge ability by estimating impedance of the battery.

BACKGROUND ART

Technologies for estimating aging level or discharge ability of a battery installed in a motor vehicle and the like are known since the past and there is one as described in Patent Document 1 for example.

Because impedance of a battery is strongly correlated with aging level or discharge ability of the battery in general, it is possible to estimate the aging level or the discharge ability of the battery if the impedance of the battery can be detected and is used. It then becomes possible to determine whether the battery is depleted or the discharge ability is lowered by estimating the aging level or the discharge ability of the battery and to urge a user of the battery to replace the battery when the battery is depleted or the discharge ability is lowered.

As a method for estimating the aging level or the discharge ability of a battery in a power system provided with the battery, there has been known a method of passing a predetermined charge current or discharge current to the battery, of measuring the current and voltage at that time and of calculating impedance from the measured current and voltage through predetermined arithmetic operations.

While the impedance of the battery becomes an index that accurately indicates the aging level or the discharge ability of the battery in a well-conditioned environment such as a laboratory, the measurement of the impedance is carried out actually in environments exposed to noises generated from electrical equipments typically in measuring impedance of a car battery for example. Due to that, the battery aging determining method described in Patent Document 1 proposes a method of passing a discharge current having a constant frequency by discharging at a constant period and by Fourier-transforming current and voltage waveforms of the discharge current to obtain the impedance.

[Patent Document 1] Japanese Patent No. 3367320

Problems to be Solved by the Invention

However, the prior art impedance measuring method described above has the following problems. The impedance of the battery is affected not only by noises but also by a charge condition and polarization of the battery. In order to obtain the impedance in high precision by removing such influences, it is preferable to pass a current so that a charge electric quantity is equalized with a discharge electric quantity as shown in FIG. 2 for example. Although it is possible to readily realize such a thing as to pass such current through the battery in the environment such as a laboratory, it is unable to feed such current that alternately changes to/from positive from/to negative as shown in FIG. 2 by the battery installed in the actual vehicle. It is necessary to install a so-called bipolar power source in the vehicle to feed such current, increasing a cost.

Then, there is widely and generally used a method of measuring current and voltage responses of only discharge as shown in FIG. 3 and of calculating the impedance from the measured current and voltage for the battery installed in the vehicle. When the impedance is calculated from the responses of only such discharge, it is known that its response voltage width gradually drops as shown in FIG. 4 because only the discharges are repeatedly carried out on the battery. When the voltage width indicates such responses, the impedance calculated by simply dividing the response voltage by the applied current varies along with the variation of the response voltages. Accordingly, it is unable to accurately estimate the aging level or the discharge ability of the battery from the impedance thus obtained.

Accordingly, the invention aims at solving the abovementioned problem by providing a battery condition estimating method and a power system enabling to estimate aging level or discharge ability of a battery by reducing transient changes of response voltages caused by repetitive discharges.

Means for Solving the Problems

In order to solve the aforementioned problem, according to a first aspect of the invention, there is provided a battery condition estimating method comprising steps of estimating impedance of a battery from a current value and a response voltage of the battery when the battery is discharged with a predetermined discharge pattern and of estimating aging level or discharge ability of the battery by using the impedance, and is characterized in that the discharge pattern is formed so that the response voltage during the discharge becomes substantially constant.

Another aspect of the battery condition estimating method of the invention is characterized in that the discharge pattern is formed by making discharge current ranges and durations constant and by adjusting a recovery time during which the discharge is stopped so that the response voltage during the discharge becomes substantially constant.

Another aspect of the battery condition estimating method of the invention is characterized in that the discharge pattern is formed by sequentially prolonging the recovery time so that the response voltage during the discharge becomes substantially constant.

Another aspect of the battery condition estimating method of the invention is characterized in that the recovery time $Th(N)$ is calculated from the following equation:

$$Th(N)=A+B+\exp(N)$$

where, a number of times of discharge is denoted by N, adjustable parameters as A and B and the recovery time until when a N-th discharge is started as $Th(N)$.

Another aspect of the battery condition estimating method of the invention is characterized in that the recovery time $Th(N)$ is calculated from the following equation when the number of times of discharge N is equal to or less than a predetermined number of times:

$$Th(N)=C+D\times N$$

where, the number of times of discharge is denoted by N, adjustable parameters as C and D and the recovery time until when a N-th discharge is started as $Th(N)$.

According to a first aspect of a power system of the invention, a power system comprises a battery, a discharge circuit for discharging a current from the battery at predetermined current value, a current sensor for measuring the current of the battery, a voltage sensor for measuring voltage of the battery and a control means for controlling the discharge circuit, and is characterized in that the control means controls the discharge circuit so that response voltage during the discharge measured by using the voltage sensor becomes substantially constant.

Another aspect of the power system of the invention is characterized in that the control means outputs a discharge request signal that makes discharge current ranges and durations constant to the discharge circuit per each predetermined recovery time.

Another aspect of the power system of the invention is characterized in that the control means outputs the discharge request signal to the discharge circuit while sequentially prolonging the recovery time.

Another aspect of the power system of the invention is characterized in that the control means calculates the recovery time Th(N) by the following equation and outputs the discharge request signal to the discharge circuit:

$$Th(N)=A+B+\exp(N)$$

where, a number of times of discharge is denoted by N, adjustable parameters as A and B and the recovery time until when a N-th discharge is started as Th(N).

Another aspect of the power system of the invention is characterized in that when the number of times of discharge N is equal to or less than a predetermined number of times, the control means calculates the recovery time Th(N) by the following equation and outputs the discharge request signal to the discharge circuit:

$$Th(N)=C+D \times N$$

where, the number of times of discharge is denoted by N, adjustable parameters as C and D and the recovery time until when a N-th discharge is started as Th(N).

Advantageous Effects

Thus, the invention can provide the battery condition estimating method and the power system capable of estimating the aging level or the discharge ability of the battery in high precision by reducing the transient changes of the response voltages caused by the repetitive discharges.

BEST MODES FOR CARRYING OUT THE INVENTION

Figure 1:
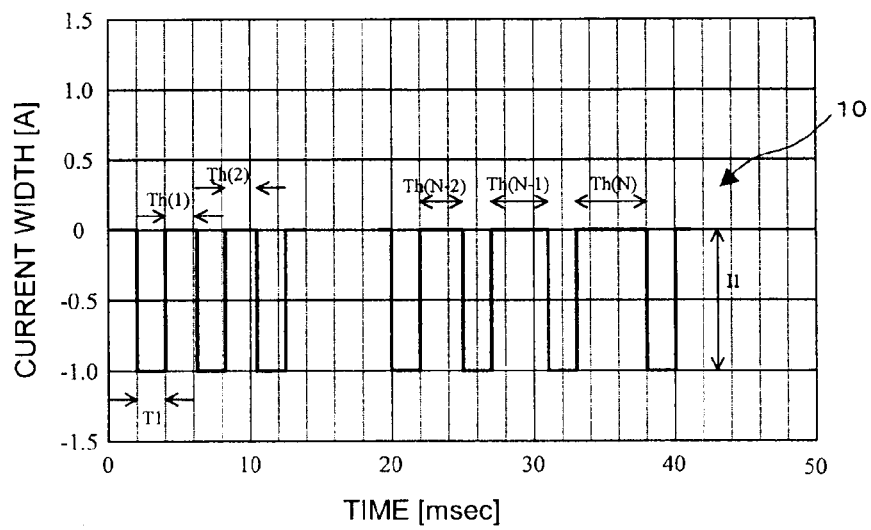
FIG. 1 is a graph showing one exemplary discharge pattern used in a battery condition estimating method of a first embodiment of the invention.
Figure 2:
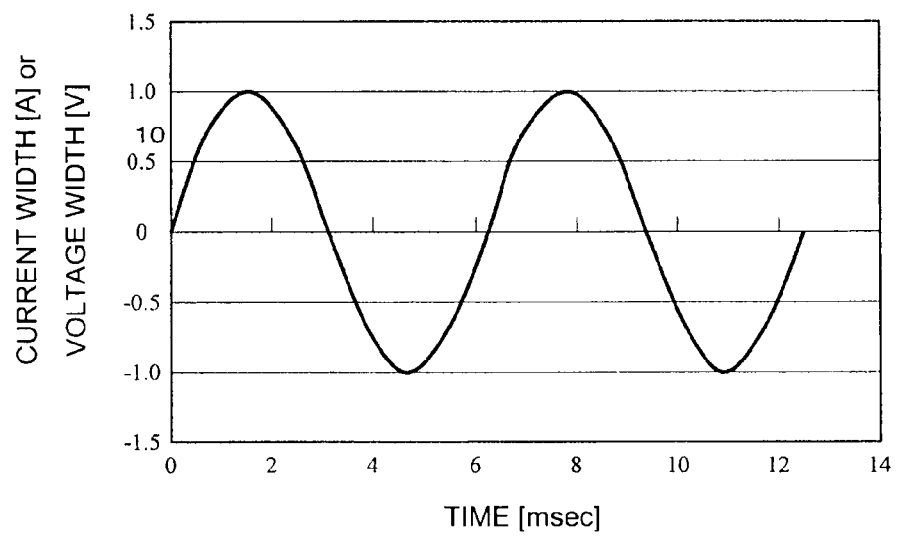
FIG. 2 is a graph showing one exemplary discharge pattern formed so that a charge electric quantity is equalized with a discharge electric quantity.
Figure 3:
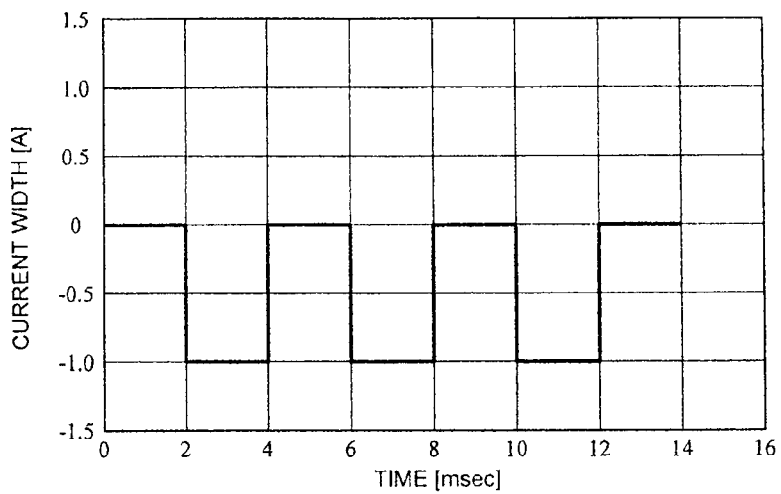
FIG. 3 is a graph showing one prior art exemplary discharge pattern of only discharge.

A battery condition estimating method and a power system according to preferred embodiments of the invention will be explained below in detail below with reference to the drawings. It is noted that each component having the same or corresponding function will be denoted by the same reference numeral in order to simplify its illustration and explanation.

First Embodiment

Figure 4:
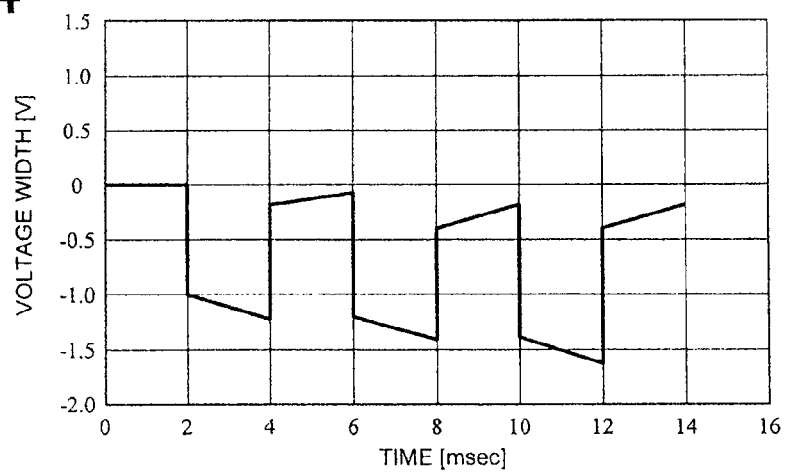
FIG. 4 is a graph showing response voltages when the prior art discharge pattern of only discharge is used.
Figure 5:
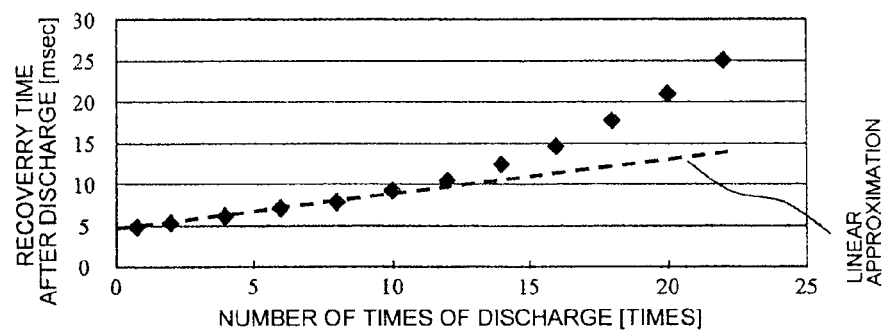
FIG. 5 is a graph showing recovery times after certain pulsed discharge.

The battery condition estimating method of a first embodiment of the invention will be explained below with reference to FIG. 1 and FIGS. 5 through 8. It has been previously explained that a response voltage width gradually drops as shown in FIG. 4 when only discharge is repeatedly carried out on the battery. This occurs due to influences of polarization and stratification within the battery and it takes a predetermined time to return to a stable condition by reducing such influences. Still more, there is such a characteristic in the time required to return to the stable condition that the more the number of times of discharge, the longer the time is. FIG. 5 shows a result of the recovery time required for returning to the original voltage measured after implementing constant pulsed discharge for example. As shown in FIG. 5, it can be seen that the more the number of times of discharge, the longer the recovery time after discharge is and still more, the more the number of times of discharge, the more acceleratingly the increase rate of the recovery time grows.

Figure 6:
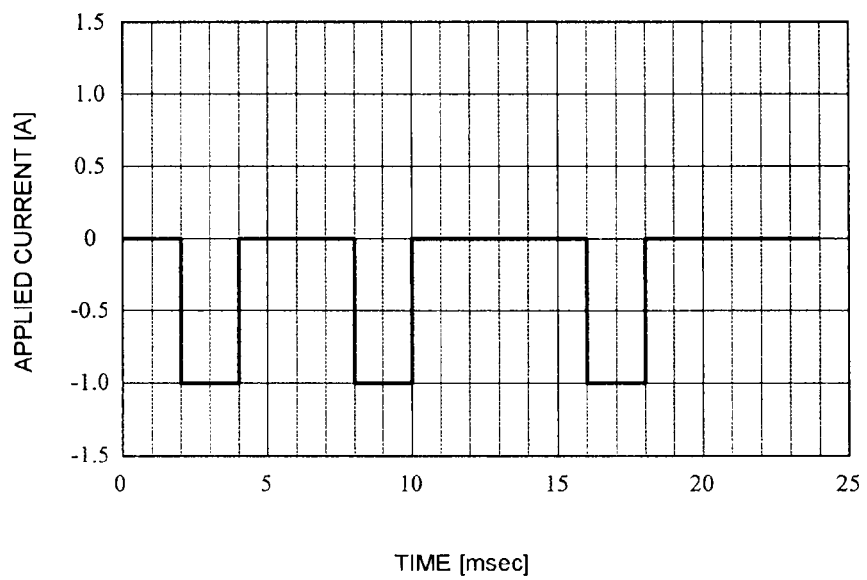
FIG. 6 is a graph showing an applied current pattern in which the recovery times are prolonged along with a number of times of discharge.
Figure 7:
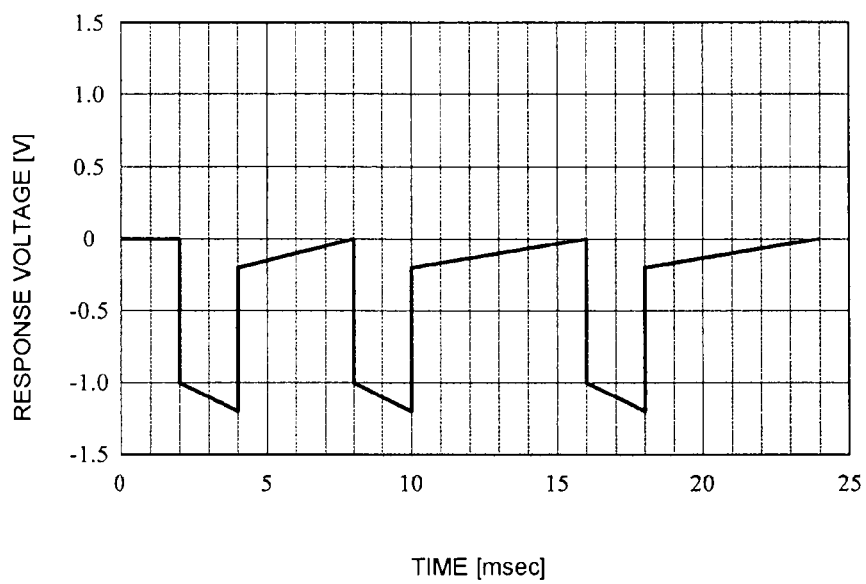
FIG. 7 is a graph showing response voltage when the discharge pattern in which the recovery time is prolonged along with the number of times of discharge is used.

Then, by taking the characteristic of the recovery time of the battery as shown in FIG. 5 into consideration, time intervals of discharge from the battery are prolonged with the number of times of discharge in the battery condition estimating method of the present embodiment. When durations (time width: referred to as T1 hereinafter) and current ranges (current width: referred to as I1 hereinafter) to be applied as an applied current are made constant as shown in FIG. 6, it becomes possible so that response voltages become substantially constant as shown in FIG. 7 by adequately prolonging the application intervals with the number of times of discharge.

When the constant response voltages can be obtained with respect to the constant applied current (the application duration T1 and the current range I1 are constant), it becomes possible to obtain a constant value as impedance by dividing the response voltage by the applied current. Because the battery is not yet in a stable condition in which the polarization, the stratification and others are eliminated at this time, the impedance is not what obtained when the battery is stable. Then, the impedance calculated as described above will be referred to as impedance in a metastable condition. There is a one-to-one relationship between the impedance in the stable condition and the aging level or the discharge ability of the battery and it is possible to detect the aging level or the discharge ability of the battery from the impedance in the stable condition by using this relationship.

However, because the contact response voltage is obtained with respect to the constant applied current in the battery condition estimating method of the present embodiment, the one-to-one relationship holds also between the impedance in the metastable condition and the aging level or discharge ability of the battery at this time. Then, the relationship between the impedance in the metastable condition and the aging level or the discharge ability of the battery is obtained in advance and the aging level or the discharge ability of the battery is detected from the impedance in the metastable condition by using this relationship in the battery condition estimating method of the present embodiment. The aging level or the discharge ability of the battery is estimated below by using a relational expression F(X) (X is the impedance in the metastable condition) prepared in advance as the relationship between the impedance in the metastable condition and the aging level or the discharge ability of the battery.

The relationship between the number of times of discharge and the recovery time until starting discharge is approximated by the following equation in the battery condition estimating method of the present embodiment:

$$Th(N) = A + B + \exp(N) \qquad \text{Eq. 1}$$

where, N denotes the number of times of discharge and Th(N) denotes the recovery time until when a discharge of Nth time is started. The changes of the recovery time shown in FIG. 5 is approximated by using an exponential function and parameters A and B in the equation 1 are determined by optimally approximating the equation 1 by using data of the recovery time in FIG. 5. FIG. 1 shows one exemplary discharge pattern in which the recovery time Th(N) is determined by using the equation 1.

The measured response voltages assume substantially constant values by discharging the battery by using the discharge pattern 10 shown in FIG. 1. Then, the impedance X in the metastable condition can be calculated from the measured response voltage and the discharge current shown in FIG. 1. Thereby, it becomes possible to determine the aging level or the discharge ability of the battery by using the relational expression F(X).

Figure 8:
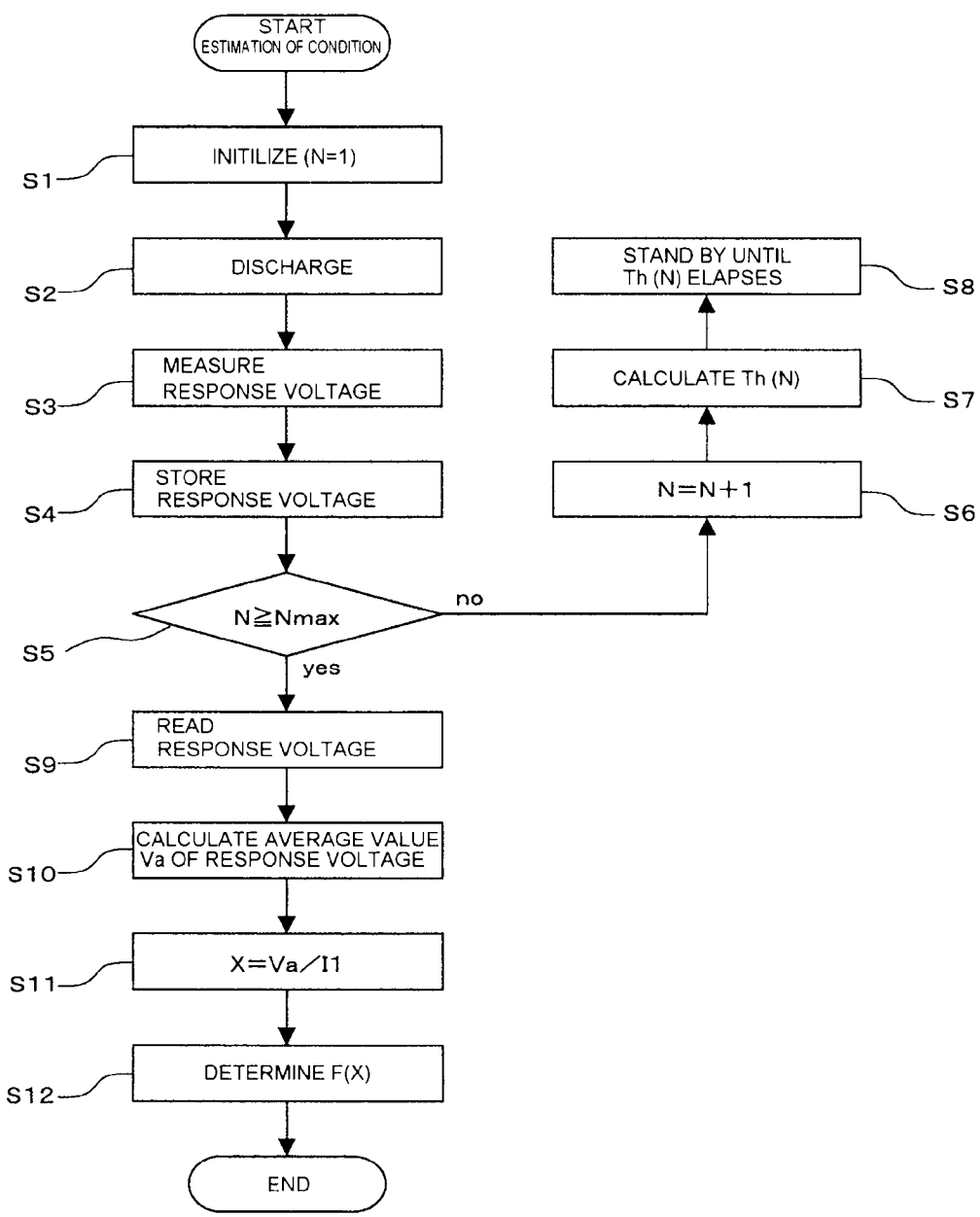
FIG. 8 is a flowchart showing a flow of processes of the battery condition estimating method of the first embodiment.

The battery condition estimating method of the present embodiment will be explained in detail below by using a flowchart shown in FIG. 8. Here, the relational expression Th(N) between the number of times of discharge and the recovery time until starting discharge in the equation 1 and the relational expression F(X) between the impedance X in the metastable condition and the aging level or the discharge ability of the battery are prepared in advance and the estimation of the condition of the battery is carried out by using them.

When the process for detecting the condition of the battery is started, the number of times of discharge N is initialized to 1 in step S1. Then, the discharge with the discharge range I1 and the discharge duration T1 is carried out on the battery in a next step S2. In step S3, the response voltage is measured during the period of discharge carried out in the step S2. In step S4, the response voltage measured during the discharge period in the step S2 is stored in a predetermined memory and the like. As the response voltage to be stored, the lowest response voltage can be selected for example in the exemplary response voltage shown in FIG. 7. Or, it is also possible to use an average value of the voltages measured during the discharge period. In any case of using the either response voltages, it is necessary to prepare the relational expression F(X) between the impedance X and the aging level or the discharge ability of the battery in advance corresponding to the case.

It is judged whether or not the number of times of discharge N has reached a target number of times (denoted as Nmax) in step S5 and if not reached the target number of times, the process is advanced to step S6. In step S6, 1 is added to the number of times of discharge N and the recovery time Th(N) until when a discharge of the Nth time is started is calculated in step S7. Then, the process waits until when the recovery time Th(N) elapses in step S8. When the recovery time Th(N) elapses, the process returns to the step S2 again to repeat the processes until the step S4.

When it is judged that the number of times of discharge N has reached the target number of times Nmax in the step S5, the process advances to step S9 and reads all response voltages stored in the step S4. Then, an average value Va of the read response voltages is calculated in step S10. Although almost constant response voltages can be obtained regardless of the number of times of discharge N by the battery condition estimating method of the present embodiment, the average value is calculated in order to reduce variations of the measured values of the response voltages. When the variation of the measured values of the response voltages is fully small, it is not always necessary to carry out the process of the step S10 and any one of the response voltages may be used.

In step S11, the impedance X is calculated from the following equation from the response voltage Va calculated in step S10 and the discharge range I1.

$$X = Va/T1 \qquad \text{Eq. 2}$$

In step S12, F(X) is judged (compared with a predetermined threshold value) by using the impedance X calculated by the above equation to determine the aging level or the discharge ability of the battery.

It is noted that while the discharge range I1 is used in the calculation of the impedance X in step S11 in the flow of the processes described above, it is also possible to use a current measured value instead of the discharge range. In this case, the current is measured together with the response voltage in the step S3 and the current measured value is also stored in the memory together with the response voltage in the step S4. It becomes possible to calculate the impedance X by using the current measured value stored in the memory in the step S11.

As described above, according to the battery condition estimating method of the present embodiment, it becomes possible to reduce and to substantially uniform the transient changes of the response voltages otherwise caused by the repetitive discharges and to estimate the aging level or the discharge ability of the battery in high precision by using this response voltage.

Second Embodiment

Figure 9:
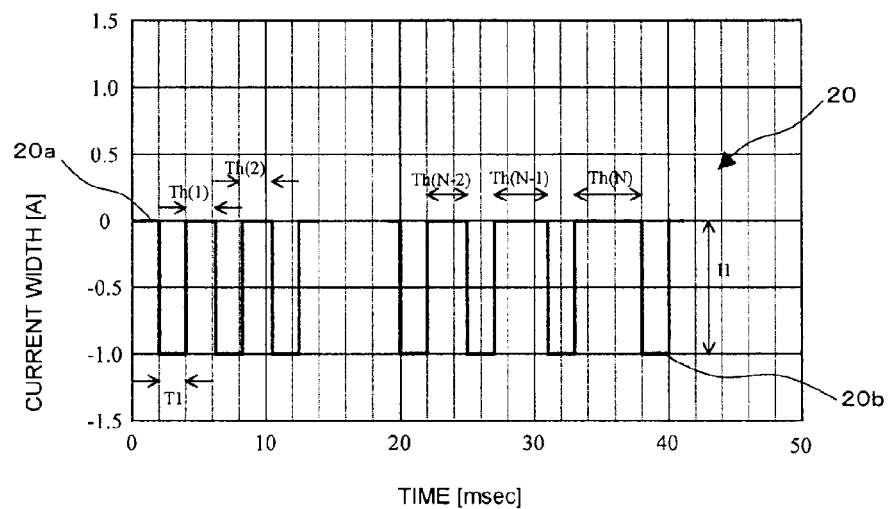
FIG. 9 is a graph showing one exemplary discharge pattern used in a battery condition estimating method according to a second embodiment of the invention.

A battery condition estimating method according to a second embodiment of the invention will be explained below with reference to FIG. 9. In the battery condition estimating method of the present embodiment, the relationship between the number of times of discharge N and the recovery time until starting a discharge is approximated by using the following equation 3 instead of the equation 1 of the first embodiment:

$$Th(N) = C + D \times N \text{(when } N \leq Nb\text{)} \qquad \text{Eq. 3}$$

Or, $$Th(N) = A + B + \exp(N) \text{(when } N > Nb\text{)} \qquad \text{Eq. 4}$$

The recovery time Th(N) is calculated by approximation of a linear expression of the number of times of discharge N when the number of times of discharge N is equal to or less than a predetermined number of times Nb in the equation 3. When the number of times of discharge N is larger than the predetermined number of times Nb, the recovery time Th(N) is calculated by the exponential function of the number of times of discharge N shown in the equation 4 similarly to the first embodiment. FIG. 9 shows one exemplary discharge pattern used in the battery condition estimating method of the present embodiment. A discharge pattern 20a in an initial period after starting the discharge is what the recovery time is calculated by using the equation 3 and a discharge pattern 20b is what the recovery time is calculated by using the equation 4.

Thus, it becomes possible to reduce a burden of an arithmetic processing unit used in calculating the recovery time Th(N) by calculating the recovery time by using the linear expression shown in the equation 3 when the number of times of discharge is small in the battery condition estimating method of the present embodiment.

Figure 10:
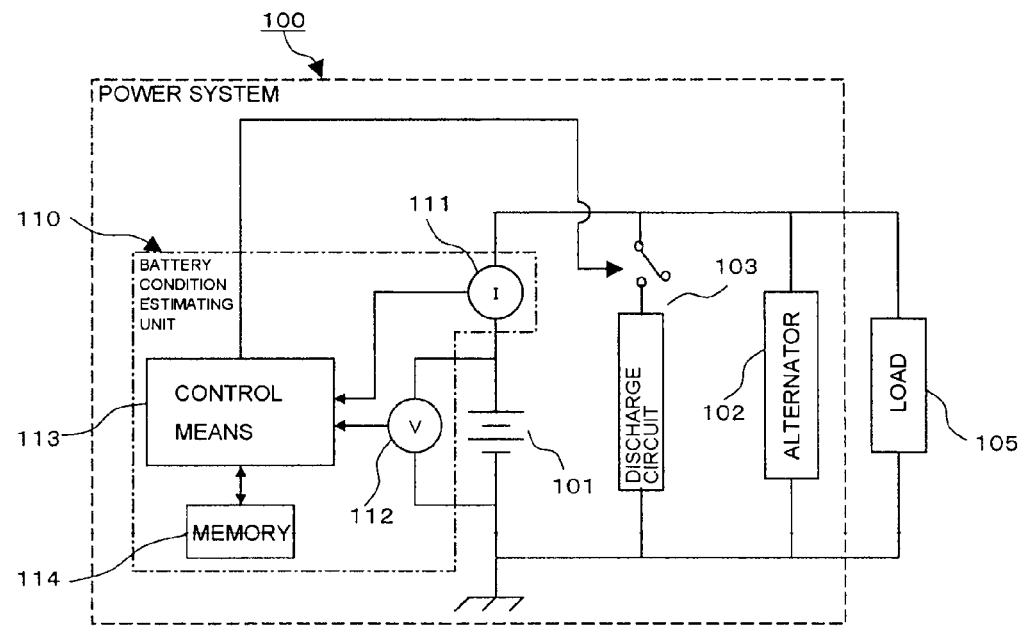
FIG. 10 is a block diagram showing a schematic configuration of a power system according to one embodiment of the invention.

An embodiment of the power system of the invention will be explained below with reference to FIG. 10. FIG. 10 is a block diagram showing a configuration of the power system 100 of the present embodiment. The power system 100 comprises a battery 101, an alternator 102 that charges the battery 101, a discharge circuit 103 that discharges with a predetermined discharge current from the battery 101 and a battery condition estimating unit 110 that estimates the condition of the battery 101. The battery 101 is also connected with a load 105.

The battery condition estimating unit 110 comprises a current sensor 111, a voltage sensor 112, a control means 113 and a memory 114. The battery condition estimating methods of the first and second embodiments are processed by using the control means 113. That is, the control means 113 outputs a discharge request signal with the discharge range I1 and the discharge duration T1 to the discharge circuit 103 to discharge and measures the current and response voltage during that time by using the current sensor 111 and the voltage sensor 112, respectively. The control means 113 also calculates the recovery time until starting a discharge and at a point of time reaching the recovery time, outputs a discharge request signal again to the discharge circuit 103 to discharge. The currents and response voltages measured by the current sensor 111 and the voltage sensor 112 are stored in the memory 114 and are used in calculation of the impedance after finishing all discharges.

The power system of the present embodiment configured as described above permits to estimate the condition of the battery 101 in high precision by using the battery condition estimating methods of the first and second embodiments to inform of the aging level or the discharge ability of the battery 101 adequately to the user.

It is noted that the description of the present embodiment indicates only one exemplary battery condition estimating method and power system of the invention and the invention is not limited to that. Detailed configuration and operations of the battery condition estimating method and the power system of the present embodiment may be adequately modified within a scope not departing from the spirit of the invention.

REFERENCE NUMERALS

100 Power system
101 Battery
102 Alternator
103 Discharge circuit
105 Load
110 Battery condition estimating unit
111 Current sensor
112 Voltage sensor
113 Control means
114 Memory

The invention claimed is:

1. A battery condition estimating method comprising steps of:
    estimating impedance of a battery from a current value and a response voltage of said battery when said battery is discharged with a predetermined discharge pattern multiple times during one time of said estimating of the impedance; and
    estimating aging level or discharge ability of said battery by using the impedance,
    wherein said predetermined discharge pattern is formed by making discharge current ranges and durations constant and by adjusting a recovery time during which said discharge is stopped so that the response voltage during each discharge becomes substantially constant.

2. The battery condition estimating method according to claim 1, wherein said predetermined discharge pattern is formed by sequentially prolonging said recovery time so that the response voltage during said each discharge becomes substantially constant.

3. The battery condition estimating method according to claim 1, wherein said recovery time Th(N) is calculated from the following equation:

$$Th(N)=A+B+\exp(N)$$

where, a number of times of discharge is denoted by N, adjustable parameters as A and B and said recovery time until when a N-th discharge is started as Th(N).

4. The battery condition estimating method according to claim 2, wherein said recovery time Th(N) is calculated from the following equation:

$$Th(N)=A+B+\exp(N)$$

where, a number of times of discharge is denoted by N, adjustable parameters as A and B and said recovery time until when a N-th discharge is started as Th(N).

5. The battery condition estimating method according to claim 1, wherein said recovery time Th(N) is calculated from the following equation when the number of times of discharge N is equal to or less than a predetermined number of times:

$$Th(N)=C+D\times N$$

where, the number of times of discharge is denoted by N, adjustable parameters as C and D and the recovery time until when a N-th discharge is started as Th(N).

6. The battery condition estimating method according to claim 2, wherein said recovery time Th(N) is calculated from the following equation when the number of times of discharge N is equal to or less than a predetermined number of times:

$$Th(N)=C+D\times N$$

where, the number of times of discharge is denoted by N, adjustable parameters as C and D and the recovery time until when a N-th discharge is started as Th(N).

7. The battery condition estimating method according to claim 3, wherein said recovery time Th(N) is calculated from the following equation when the number of times of discharge N is equal to or less than a predetermined number of times:

$$Th(N)=C+D\times N$$

where, the number of times of discharge is denoted by N, adjustable parameters as C and D and the recovery time until when a N-th discharge is started as Th(N).

8. The battery condition estimating method according to claim 4, wherein said recovery time Th(N) is calculated from the following equation when the number of times of discharge N is equal to or less than a predetermined number of times:

$$Th(N)=C+D\times N$$

where, the number of times of discharge is denoted by N, adjustable parameters as C and D and the recovery time until when a N-th discharge is started as Th(N).

9. A battery condition estimating method comprising steps of:
  estimating impedance of a battery from a current value and a response voltage of said battery when said battery is discharged with a predetermined discharge pattern multiple times during one time of said estimating of the impedance; and
  estimating aging level or discharge ability of said battery by using the impedance, wherein
  said predetermined discharge pattern is formed so that peaks in the response voltage during repeated discharges are made substantially constant during each discharge by prolonging time intervals of discharges from the battery.

10. The battery condition estimating method according to claim 9,
  wherein said predetermined discharge pattern is formed by making discharge current ranges and durations constant and by adjusting a recovery time during which said discharge is stopped so that the peaks in the response voltage during said each discharge become substantially constant.

11. The battery condition estimating method according to claim 10, wherein said predetermined discharge pattern is formed by sequentially prolonging said recovery time.

12. The battery condition estimating method according to claim 10, wherein said recovery time Th(N) is calculated from the following equation:

$$Th(N)=A+B+\exp(N)$$

where, a number of times of discharge is denoted by N, adjustable parameters as A and B and said recovery time until when a N-th discharge is started as Th(N).

13. The battery condition estimating method according to claim 11, wherein said recovery time Th(N) is calculated from the following equation:

$$Th(N)=A+B+\exp(N)$$

where, a number of times of discharge is denoted by N, adjustable parameters as A and B and said recovery time until when a N-th discharge is started as Th(N).

14. The battery condition estimating method according to claim 10, wherein said recovery time Th(N) is calculated from the following equation when the number of times of discharge N is equal to or less than a predetermined number of times:

$$Th(N)=C+D\times N$$

where, the number of times of discharge is denoted by N, adjustable parameters as C and D and the recovery time until when a N-th discharge is started as Th(N).

15. The battery condition estimating method according to claim 11, wherein said recovery time Th(N) is calculated from the following equation when the number of times of discharge N is equal to or less than a predetermined number of times:

$$Th(N)=C+D\times N$$

where, the number of times of discharge is denoted by N, adjustable parameters as C and D and the recovery time until when a N-th discharge is started as Th(N).

16. The battery condition estimating method according to claim 12, wherein said recovery time Th(N) is calculated from the following equation when the number of times of discharge N is equal to or less than a predetermined number of times:

$$Th(N)=C+D\times N$$

where, the number of times of discharge is denoted by N, adjustable parameters as C and D and the recovery time until when a N-th discharge is started as Th(N).

17. The battery condition estimating method according to claim 16, wherein said recovery time Th(N) is calculated from the following equation when the number of times of discharge N is equal to or less than a predetermined number of times:

$$Th(N)=C+D\times N$$

where, the number of times of discharge is denoted by N, adjustable parameters as C and D and the recovery time until when a N-th discharge is started as Th(N).

* * * * *